(12) United States Patent
Ting et al.

(10) Patent No.: US 6,320,412 B1
(45) Date of Patent: *Nov. 20, 2001

(54) ARCHITECTURE AND INTERCONNECT FOR PROGRAMMABLE LOGIC CIRCUITS

(75) Inventors: Benjamin S. Ting, Saratoga; Peter M. Pani, Mountain View, both of CA (US)

(73) Assignee: BTR, Inc. c/o Corporate Trust Co., Reno, NV (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/467,736

(22) Filed: Dec. 20, 1999

(51) Int. Cl.$^7$ ................................................. H03K 19/177
(52) U.S. Cl. ............................... 326/41; 326/40; 326/39; 326/38
(58) Field of Search ................................. 326/37, 38, 39, 326/40, 41

(56) References Cited

U.S. PATENT DOCUMENTS

| | | |
|---|---|---|
| Re. 34,363 | 8/1993 | Freeman . |
| 4,020,469 | 4/1977 | Manning . |
| 4,661,901 | 4/1987 | Veneski . |
| 4,700,187 | 10/1987 | Furtek . |
| 4,720,780 | 1/1988 | Dolecek . |
| 4,736,333 | 4/1988 | Mead et al. . |
| 4,758,745 | 7/1988 | Elgamal . |
| 4,847,612 | 7/1989 | Kaplinsky . |
| 4,870,302 | 9/1989 | Freeman . |
| 4,912,342 | 3/1990 | Wong et al. . |
| 4,918,440 | 4/1990 | Furtek . |
| 4,935,734 | 6/1990 | Austin . |
| 4,992,680 | 2/1991 | Benedetti et al. . |
| 5,144,166 | 9/1992 | Camarota et al. . |
| 5,204,556 | 4/1993 | Shankar . |
| 5,208,491 | 5/1993 | Ebeling et al. . |
| 5,221,865 | 6/1993 | Phillips et al. . |

(List continued on next page.)

FOREIGN PATENT DOCUMENTS

| | | |
|---|---|---|
| 0415542 | 3/1991 | (EP) . |
| 0630115A2 | 6/1994 | (EP) . |
| 2180382 | 3/1987 | (GB) . |
| 2295738 | 5/1996 | (GB) . |
| 9208286 | 5/1992 | (WO) . |
| 9410754 | 5/1994 | (WO) . |
| 94/28475 | 12/1994 | (WO) . |
| 9504404 | 2/1995 | (WO) . |
| 9605964 | 4/1996 | (WO) . |
| WO96/35261 | 11/1996 | (WO) . |

OTHER PUBLICATIONS

R Cliff, et al., "A Dual Granularity and Globally Interconnected Architecture for a Programmable Logic Device," IEEE 1993 Custom Integrated Circuits Conf., pp. 7.3.1–7.3.5 (May 9–12,1993).

(List continued on next page.)

Primary Examiner—Michael Tokar
Assistant Examiner—Vibol Tan
(74) Attorney, Agent, or Firm—Blakely, Sokoloff, Taylor & Zafman LLP

(57) ABSTRACT

An improved programmable logic device and interconnect architecture is provided. In one embodiment an interconnect network provides programmable routing between calls. In one embodiment the interconnect network includes first routing lines of a first level of routing lines, second routing lines of a second level of routing lines and third routing lines of a third level of routing lines. The first and second routing lines are programmably and bidirectionally coupled to the third routing lines such that signals are selectively driven from either the first or second routing lines to the third routing lines and signals are selectively driven from the third routing lines to the first routing lines and second routing lines.

38 Claims, 4 Drawing Sheets

U.S. PATENT DOCUMENTS

| | | |
|---|---|---|
| 5,243,238 | 9/1993 | Kean . |
| 5,260,610 | 11/1993 | Pederson et al. . |
| 5,296,759 | 3/1994 | Sutherland et al. . |
| 5,298,805 | 3/1994 | Garverick et al. . |
| 5,329,470 | 7/1994 | Sample et al. . |
| 5,349,691 | 9/1994 | Harrison et al. . |
| 5,369,314 | 11/1994 | Patel et al. . |
| 5,396,126 | 3/1995 | Britton et al. . |
| 5,406,525 | 4/1995 | Nicholes . |
| 5,444,394 | 8/1995 | Watson et al. . |
| 5,455,525 | 10/1995 | Ho et al. . |
| 5,457,410 | 10/1995 | Ting . |
| 5,469,003 | 11/1995 | Kean . |
| 5,477,067 | 12/1995 | Isomura et al. . |
| 5,519,629 | 5/1996 | Snider . |
| 5,537,057 | 7/1996 | Leong et al. . |
| 5,550,782 | 8/1996 | Cliff et al. . |
| 5,552,722 | 9/1996 | Kean . |
| 5,572,148 | 11/1996 | Lytle et al. . |
| 5,581,199 | 12/1996 | Pierce et al. . |
| 5,581,767 | 12/1996 | Katuski et al. . |
| 5,815,004 | 9/1998 | Trimberger et al. . |
| 5,825,202 | 10/1998 | Tavana et al. . |
| 5,835,405 | 11/1998 | Tsui et al. . |
| 5,850,564 * | 12/1998 | Ting et al. ............... 395/800.37 |
| 5,903,165 | 5/1999 | Jones et al. . |
| 6,016,063 * | 1/2000 | Trimberger ............... 326/81 |
| 6,034,547 * | 3/2000 | Pani et al. ............... 326/41 |
| 6,038,627 * | 3/2000 | Plants ............... 710/126 |
| 6,051,991 * | 4/2000 | Ting ............... 326/41 |
| 6,088,526 * | 7/2000 | Ting et al. ............... 395/800.33 |
| 6,160,420 | 12/2000 | Gamal . |

OTHER PUBLICATIONS

B. Britton, et al., "Optimized Reconfigurable Cell Array Architecture for High–Performance Field Programmable Gate Arrays," IEEE Custom Integrated Circuit Conf., pp. 7.2.1–7.2.5 (May 9–12,1993).

Xilinx, "The Programmable Gate Array Data Book," 1992. Altera Corporation, Data Sheet, "Flex EPF81188 12,000–Gate Programmable Logic Device," Sep. 1992, ver. 1.

Minnick, R. C. "A Survey of Microcellular Research, Journal of the Association for Computing Machinery," vol. 14, No. 2, Apr. 1967, pp. 203–241.

Shoup, R. G., "Programmable Cellular Logic Arrays," Ph.D. dissertation, Carnegie–Mellon University, Pittsburg, PA, Mar. 1970–Partial.

Spandorfer, L.M., "Synthesis of Logic Function on an Array of Integrated Circuits," UNIVAC.

F. Zlotnick, P. Butler, W. Li, D. Tang, "A High Performance Fine–Grained Approach SRAM Based FPGAs," Wescon '93 Conference Record, pp. 321–326, Sep. 28–30, 1993.

Division of Sperry Rand Corporation, Blue Bell, PA, Contract AF 19(628)2907,AFCRL 66–298, Project No. 4645, Task No. 464504, Nov. 30, 1965.

P. Wang, et al., "A High Performance FPGA With Hierarchical Interconnection Structure," Institute of Electrical and Electronics Engineers, pp. 239–242 (May 30, 1994).

ATMEL Corporation, "Field Programmable Gate Arrays–AT600 Series", 1993.

Robert H. Krambeck, "ORCA: A High Performancce, Easy to Use SRAM Based Architecture", Wescon '93 Record, pp. 310–320, Sep. 28–30, 1993.

Motorola Product Brief, "MPA10xx Field Programmable Gate Arrays," Sep. 27, 1993.

Ting, et al.,"Anew High Density and Very Low Cost Reprogrammable FPGA Architecture", pp. 1–10.

"Dynamically Reconfigurable Devices Used to Implement a Self–Tuning, High Performances PID Controller", E. Buffoli, et al., 1989 IEEE, pp. 107–112.

"Boolean Decomposition of Programmable Logic Arrays", Srinivas Devadas, et al., IEEE 1988, pp. 2.5.1–2.5.5.

"Implementing Neural Nets with Programmable Logic", Jacques J. Vidal, IEEE Transactions on Acoustic, Speech, and Signal Processing, vol. 7, Jul. 1988, pp. 1180–1190.

"Design of Large Embedded CMOS PLA's in Self–Test", Dick L. Lui, et al., IEEE Transactions on Computer–Aided Design, vol. 7, No. 1, Jan. 1988, pp. 50–53.

1992 International Conference on Computer Design, "An Area Minimizer for Floorplans with L–shaped Regions", Yachyang Sun, et al., 1992 IEEE, pp. 383–386.

Dave Bursky, "Fine FPGA Architecure Uses Four Levels of Configuration Hierarchy", Electronic Design, pp. 33–34, Oct. 1, 1993.

* cited by examiner

ARCHITECTURE AND INTERCONNECT FOR PROGRAMMABLE LOGIC CIRCUITS

BACKGROUND OF THE INVENTION

1. Field of the Invention

The present invention relates to programmable logic circuits. More particularly, the present invention relates to an architecture and interconnect for programmable logic circuits.

2. Art Background

Programmable logic circuits such as field programmable gate arrays (FPGAs) provide an alternative mechanism and device to custom integrated circuits. Since its original inception, developments in the technology have lead to smaller die size and increased functionality. A number of interconnect approaches have implemented to interconnect the logic cells of an FPGA. One of the elements used in the interconnect of an FPGA is the switch which can be programmed either to conduct a signal connecting two wires or acting as an open. Early implementations provided a re-programmable logic array where a memory controlled switch was used.

The actual area on the die for the logic cells is generally just a fraction of the total area of the semiconductor device. Typically the area on the die used to implement a switch is relatively small compared to the area required for the memory cell used to control the switch with the memory cell and the switch forming the largest portion of the total core area of the die. Thus early technology attempted to address the goal of practically using the logic functions in a re-programmable gate array with the limited program controlled routing resources while keeping the die size small enough.

A preferred way to implement a logic function in FPGAs is to have the input/output of a logic cell connectable to every other logic cell; however, this is not practical for memory controlled programmable logic arrays due to the amount of die space the memory cells require. Weighing out the different factors, a number of approaches provide that the logic cell is connectable to a limited number of other logic cells and a small set of routing resources through a program control means. If a logic cell can not be program-controlled to connect directly to the desired logic cells, the routing resources are then used to achieve indirect connection, either though other routing resources or logic cells.

In U.S. Pat. No. 5,457,410 an architecture was described where a local routing resource referred to as the I-Matrix was used to interconnect a cluster of logic cells. The I-Matrix consists of both routing lines and switches to select the desired connections. The I-Matrix routing lines have the ability to connect to neighboring I-Matrix routing lines, again through the switches, hence allowing logic cells to be connectable not just inside a local cluster but adjacent clusters.

The I-Matrix allows the formations of medium sized macro functions with short, fast interconnects which are typically characterized as low fanout (e.g. a signal originating from an output of a logic cell to one or two inputs of other logic cells). The architecture also provides the concept of a block connector that can function as the input/output ports of the macro functions, in addition to being the routing resources interconnecting logic cells. A block connector also has the ability to extend to the adjacent logical blocks through programmed controlled switches.

With block connectors functioning as program selectable ports, they may be interfaced to MLA routing lines, through a bi-directiona MLA1 exchange network called referred to as Block Connector (BC) Tabs. The block connectors in one logical block are programmably connectable to MLA routing lines which in turn are connectable to other block connectors of other logical blocks and to other MLA routing lines through the Block Connector Tabs. Drivers improve the speed of the circuits through the BC Tabs which eliminates the need to design large drivers inside the logic cells as is typical of other routing networks.

In PCT WO95/04639, an alternative scheme was disclosed wherein two adjacent blocks shared a common set of different levels of MLA routing lines. Significant sized circuits can be formed, for example, in a MLA3 (M3) region (which may be, for example, 4×8 logical blocks or 8×8 logical blocks). Furthermore, the MLA Tabs similar to the BC Tabs may be included at the third hierarchical level of higher level routing lines to interface to routing lines at a fourth level and above. MLA Tab routing lines may be viewed as similar to third level routing lines except that the MLA Tabs routing lines are a subset which interfaces to yet higher levels of routing resources through the Tab Networks

SUMMARY OF THE INVENTION

An improved programmable logic device and interconnect architecture is provided. In one embodiment an interconnect network provides programmable routing between cells. In one embodiment the interconnect network includes first routing lines of a first level of routing lines, second routing lines of a second level of routing lines and third routing lines of a third level of routing lines. The first and second routing lines are programmably and bidirectionally coupled to the third routing lines such that signals are selectively driven from either the first or second routing lines to the third routing lines and signals are selectively driven from the third routing lines to the first routing lines and second routing lines.

BRIEF DESCRIPTION OF THE DRAWINGS

The objects, features and advantages of the invention will be apparent from the following detailed description in which.

DETAILED DESCRIPTION

Figure 1:
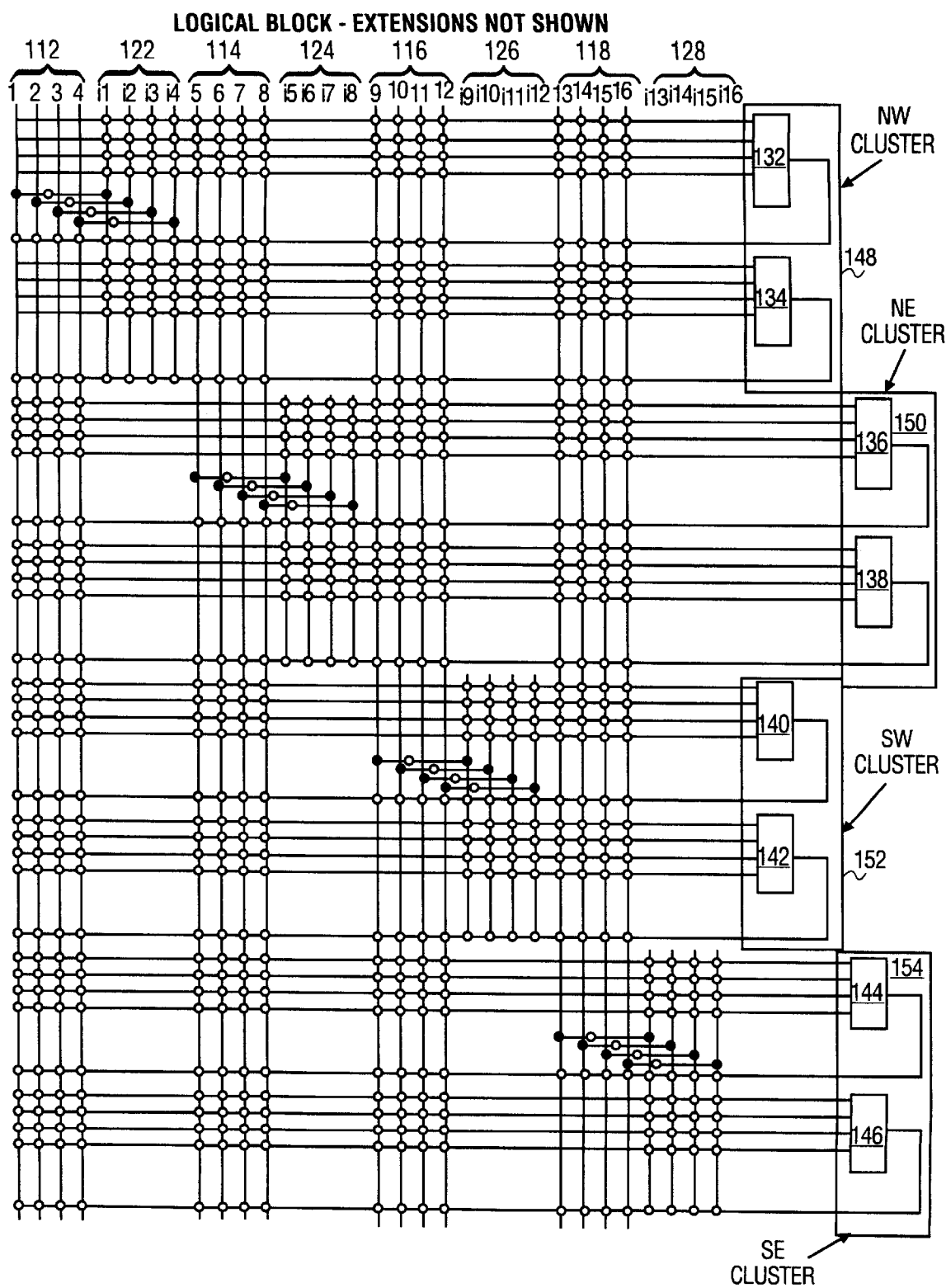
FIG. 1 illustrates one embodiment of a logical block with access lines.

An architecture and interconnect for programmable logic circuits is described. In the following description, for purposes of explanation, numerous specific details are set forth, such as combinational logic, cell configuration, numbers of cells, number of routing lines and levels of routing lines, in order to provide a thorough understanding of the present invention. It will be obvious, however, that the present invention may be practiced without these specific details. In other instances, well known structures and devices are shown in block diagram form in order to avoid unnecessarily obscuring the present invention. It should also be noted that the present invention pertains to a variety of processes including, but not limited to, static random access memory (SRAM), dynamic random access memory (DRAM), fuse, anti-fuse, erasable programmable read only memory (EEPROM), FLASH and ferroelectric processes.

In particular, in this description, a Flash based process is used as an example to illustrate the invention where in actual practice, CMOS, Anti-fuse, Flash or ferroelectric, etc. are all applicable to the architecture.

The present invention is disclosed in the context of a hierarchical interconnect system for programmable logic devices. One example is discussed in U.S. Pat. No. 5,457,410. Logic cells (which may be also referred to as CFG's LUTs and LCAs) are interconnected by the hierarchical interconnect to perform specified functions. The interconnect is implemented by using programmable interconnect, in one embodiment, by routing lines and programmable to select routing lines to use to complete the desired interconnect.

In one embodiment, a passive device switch with a controlling memory bit is integrated as a single device. In one embodiment, this may be implemented using Flash or EEPROM process technology. For further information of one implementation, see U.S. Pat. No. 5,640,344. In one embodiment, the switch is a passgate device which shares a common gate with a transistor memory cell. The passgate switch may have a thick oxide gate to avoid read disturbance and the integrated device can be implemented with a very small area (e.g. about 4–5 times smaller than a CMOS passgate-memory cell implementation). Thus, the number of switches can be relatively large when compared to those of a CMOS memory implementation and, the coverage of the logic cell inputs/outputs to I-Matrix routing lines and BC routing lines can be less sparse compared with a CMOS memory implementation without increasing the die size. In addition, with increased coverage, coupled with permutability of logic cells, the software task of place and route of a given design of a FPGA is considerably simpler and the utilization of the logic cells can be much higher than the sparse case.

In one embodiment of CMOS memory implementation the hierarchical routing scheme set forth in U.S. Pat. No. 5,457,410, there may be forty-four memory bits and forty four switches for each logical cluster, including the extension switches. Thus the total area the memory-switch devices occupy is approximately seventy percent of the core of the chip; slightly more than ten percent is the actual logic area, the remaining area is resident with tabs having bidirectional drivers to enhance the performance of the interconnect speed, both for block connectors (BCs) and for multiple level access (MLAs) lines. Using a Flash implementation, the area for a the memory-switch device is approximately 20%–25% of the CMOS memory implementation; this allows more than doubling of the memory-switch devices without increasing in the die size for the Flash process.

Using these technologies, each BC is capable of directly accessing multiple levels of MLAs through the tab network, either as an input port receiving a signal external to the block or as an output port driving a signal from within the block. In addition, BCs have other flexibility such as extensions to adjacent blocks which provide additional access. The I-Matrix (I-M) can either function as internal routing resources within a logical cluster or inter-clusters through extensions. However, in the prior art each I-M has no direct accessibility through the tab network to connect to the MLAs.

As noted in U.S. Pat. No. 5,457,410, a first level of interconnection, referred to as I-Matrix (I-M) lines provide connectability between each output of a cell belonging to a logic luster to at least one input of each of the other cells belonging to that logic cluster and each I-M line can have multiple driving sources, some of those driving sources originating from neighboring clusters. Programmable block connectors (BCs) provide connectability between logical clusters of cells and provide accessability to a hierarchical routing network defined herein as composed of multiple level access acess (MLA) lines of multiple levels. In one embodiment, the level of the MLA lines is indicative of the corresponding length of the lines. For example, the higher the level, the longer the length of the corresponding MLA lines.

In one embodiment, a first level of MLA lines is used to provide connection among sets of block connectors. A second level of MLA lines may be used to provide connectability between different routing lines of the first level and the second level. Higher level routing lines may provide similar programmable functionality. Switching networks are used to provide connectability between BC lines and MLA lines. Other switching networks may be used to provide connectability between the same level or different levels of MLA lines.

In one embodiment of the present invention, additional connectability and therefore functionality is provided. In one embodiment, a third level of routing lines, e.g., MLA 1, is used to provide increased connectivity to a first level of routing lines, e.g., the I-M lines and a second level of routing lines, e.g., the BC lines. More particularly, in one embodiment, first and second routing lines, of corresponding first and second levels of routing lines, are programmably and bidirectionally coupled to third routing lines of the third level of routing lines such that signals are selectively driven from either the first or second routing lines to the third routing lines and signals are selectively driven from the third routing lines to the first routing lines and second routing lines.

Programmable switches are utilized to perform the coupling. In one embodiment, a first set of programmable switches provide the programmable direct coupling between the first level of routing lines and the cells. In one embodiment, a second set of programmable switches programmably and directly couple inputs and outputs of the cells to the second routing lines. In one embodiment, a third set of programmable switches provide the programmable direct couples between the third routing lines and the first and second routing lines.

In one embodiment, the first level of routing lines span a corresponding logic cluster of cells, the first routing lines programmably and directly coupled through program to input and/or outputs of logic cells of the corresponding logic cluster. In one embodiment, the second level of routing lines spans a corresponding logic block, the second routing lines programmably and directly coupled to the inputs and/or outputs of logic cells of the corresponding logic block. In one embodiment, the level of routing lines spans a corresponding plurality of logic blocks. In one embodiment, routing lines of a first level of routing lines spans n logic blocks, routing lines of a second level of routing lines spans 2n logic blocks and routing lines of a third level or routing lines spans 4n logic blocks. In one embodiment, routing lines of a first level of routing lines spans n logic blocks, routing lines of a second level of routing lines spans m+n logic blocks where m is not equal to n, and routing lines of a third level of routing lines spans k+m+n logic blocks wherein k is not equal to m and n and m is not equal to n. Other variations may also be implemented, including non-multiple span lengths.

In one embodiment, a fourth level of routing lines is included, the first and second routing lines programmably and directly bidirectionally coupled to the fourth routing lines, such that signals are selectively driven from either the first or second routing lines to the fourth routing lines and signals are selectively driven from the fourth routing lines to the first routing lines and second routing lines. In one embodiment, the fourth level composed of fourth routing lines spans a corresponding plurality of logic blocks which in one embodiment may be a second plurality of logic blocks that is a factor greater than the plurality of logic blocks spanned by the third level of routing lines.

In one embodiment in which a fourth level of routing lines is used, a fourth set of programmable switches are provided to programmably and directly couple between the fourth routing lines and the first and second routing lines. In addition, programmable bidirectional drivers/receivers may be used to selectively drive signals between the fourth routing lines and the first and/or second routing lines.

In the programmable logic device of the present invention, a refinement is made to allow I-Matrix routing lines to have direct accessibility to the Multiple Level Access (MLAs) lines. One embodiment is shown in FIG. 1. FIG. 1 illustrates a logical block with access allocations from I-Matrix routing lines, 122, 124, 126, 128 and BC routing lines 112, 114, 116, 118 to the inputs/outputs of logic cells 132, 134, 136, 138, 140, 142, 144, 146 within a logical block. In one embodiment, there are four I-Matrix routing lines per cluster for the NW, NE, SW, SE logical clusters 148, 150, 152, 154. Each BC line is directly accessible to the logic cells of three dusters and can access the fourth cluster through the I-Matrix routing lines. Each logic cell 132, 134, 136, 138, 140, 142, 144, 146 is identical to the other logic cells within each block. Each logic cell can either be purely combinatorial or can have one or more storage elements such as a Flip Flop attached to the output of the logic cell with program control.

It can readily be seen that with at most one BC routing line and one I-Matrix routing line illustrated, the routing resources, with the appropriate choices of switches, can connect arbitrarily to each input/output pin of every cell in the block. Excluding extensions, there are 688 memory-switches pairs utilized; including extensions, there are additional 64 device pairs for a total of 752 pairs. In comparison, for example, in an embodiment, illustrated by U.S. Pat. No. 5,457,410, there may be (25+10)×4=140 I-Matrix memory-switch pairs and (28×4×2+8×2×2)=256 BC memory-switch pairs for a total of 396 pairs in a CMOS implementation example. Using a Flash process to implement the structure, the device area will be significantly smaller than those of CMOS memory process as the actual silicon area is much smaller in the Flash case, even with the near doubling of memory-switch pairs in the logical block. The added memory-switch pairs also greatly improves both the utilization of the logic cells and the ease of software implementation for the placement and routing of a given logic design.

Figure 2:
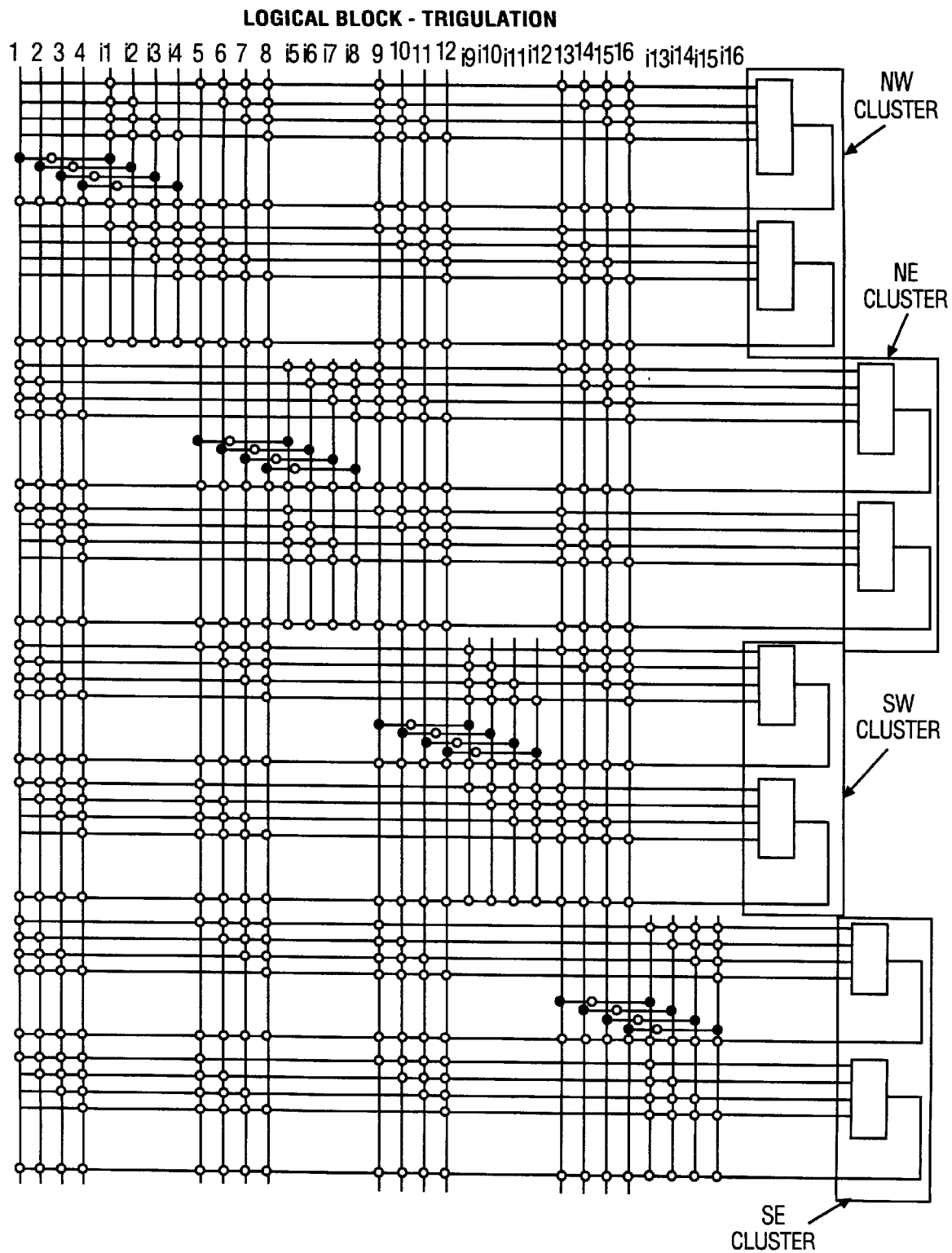
FIG. 2 illustrates the reduction of memory-switch pairs by triangulation.

Without loss of much flexibility, the number of memory-switch pairs can be greatly reduced by triangulation. In one embodiment, as shown in the FIG. 2, 192 memory-switch pairs can be eliminated by triangulation, so a total of 560 device pairs may be used in a block in the routing selection process. Two examples are set forth in FIGS. 1 and 2; there are many other alternative memory-switch assignments possible, but the two examples are provided to illustrate the concepts and the design implementation considerations.

Figure 3:
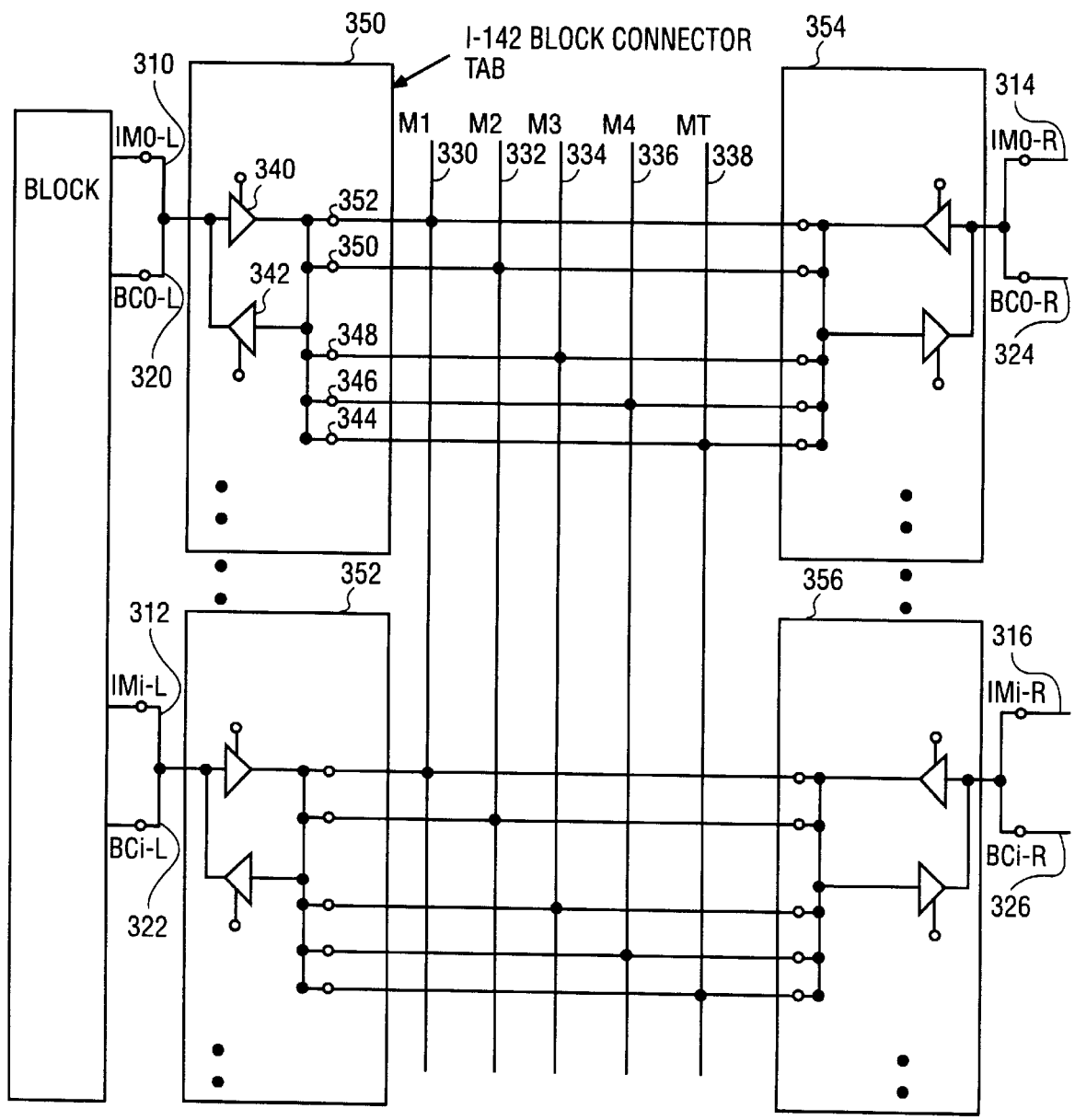
FIG. 3 illustrates one embodiment with improved MLA access from the logic block.

One embodiment illustrating the system of the present invention and improved MLA access from the logical block is illustrated by FIG. 3. FIG. 3 shows horizontal I-Matrix & BC 310, 312, 314, 316, 320, 322, 324, 326 lines and access to the vertical MLAs 330, 332, 334, 336, 338 in multiple levels. The number of MLA routing lines for each level (e.g., 330, 332, 334, 336, 338.) do not have to be the same. In one implementation, the number of MLA routing lines used for different levels may be varied over a wide range. In addition, it should be noted that the embodiment illustrated shows I-Matrix and BC access to MLA lines up to MLA4 336. In alternate embodiments, this is not necessary.

Depending on the desired performance and the die size trade-offs, the I-Matrix and BC line access can be accomplished through the Tab network (e.g., BC Tab 350) and access may be up to a lower level, (e.g., up to MLA 3 334). Alternatively, access may be provided up to a higher level (e.g., MLA 5 (not shown)). Utilizing the Tab network and providing I-Matrix/BC access up to MLA 3 334, the drivers can be significantly smaller because the drivers are sized to drive the worst case anticipated load. The capacitive loading of the longest MLA routing line is the dominant factor. Therefore, the MLA 3 lines are shorter and therefore have a smaller load than MLA 4 lines.

In one embodiment illustrated by FIG. 3, either an I-Matrix routing line or a BC routing line can access multiple levels of MLAs directly and bi-directionally through the I-M and BC Tab network with appropriately chosen switches and drivers. Thus, increased flexibility is achieved. Referring to FIG. 3, I-M lines 310, 312, 314, 316 and BC lines 320, 322, 324, 326 are programmably, directly and bidirectionally coupled to MLA lines 330, 332, 334, 336 and MLA tab 338. As noted earlier, in one embodiment, MLA tab 338 provides a programmable connection to higher level routing lines. In one embodiment signals are communicated through bidirectional drivers/receivers, for example, the programmable combination of driver 340 and receiver 342. Programmable switches, e.g., switches 344, 346, 348, 350, 352, have on/off states and programmably couple the I-M and BC lines to the MLA lines 330, 332, 334, 336 and MLA tab 338.

In addition, this flexibility, when used in conjunction with the approach illustrated in FIG. 1 further allows the effective use of I-M routing lines not just for intra-cluster(s) connections but also for inter-block(s) connections through the MLAs.

A large number of signal nets (e.g., approximately 70%) may be external to the logical block (where a signal net is an input to the logic cells of the block or an output originating inside the block) each net having a small number of pins associated with logic cells of the block (typically one to three). With logic permutability and the access architecture described in this application, I-M routing with up to one extension can be effective in connecting up 2–3 pins of logic cells within two adjacent clusters (which can be either within same logical block or by using two adjacent blocks) and at the same time having access to the Tab network to access directly to the multiple levels of MLAs. The BC routing lines can handle those signal nets with a higher number of pins inside the block which are external to the block. The adjacent cluster or block connections can usually be done by I-Matrix or BC extensions where MLAs are not required.

Figure 4:
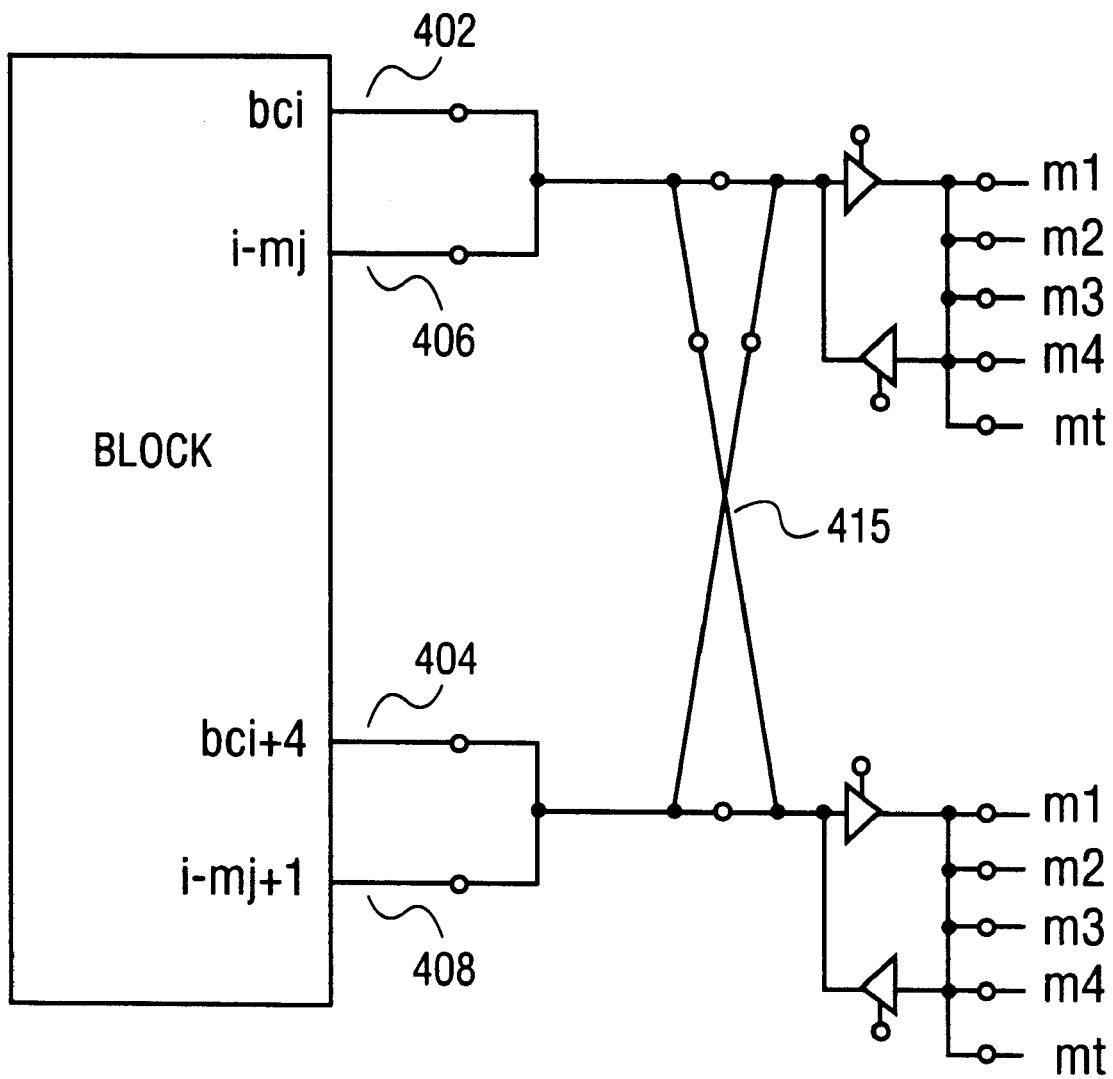
FIG. 4 illustrates one embodiment of interconnection in which additional decoding selections are provided.

In one embodiment, the I-Matrix/BC interface to the Tab Network can be made more flexible by providing additional decoding selections using an architecture illustrated by FIG. 4 where two I-M/BCs of the same logical block interface with two tab networks. In another embodiment (not shown), a set of logic cells with m I-Matrix/BC lines can have an m×n program selection exchange 415 with a set of n tabs.

In one embodiment, the MLA4 level is considered to be a hierarchical unit much like a logical block (except the unit is much larger in logic content, in one embodiment, 16×16= 256 blocks). One can treat such a unit as having intra-connection routing resources (I-Matrix, BC, M1, M2, M3, M4, MT, etc.) and access ports to the external units (MT in this case). In one embodiment, MT functions much like BC with a Tab network to access yet higher levels of MLAs (such as M5, M6, etc.). This allows appropriately sized drivers in the Tab network to have predictable performance range while avoiding large increase in the silicon die area. MT and M4 are similar except that M4 does not have direct access to the Tab network to access directly to M5, etc. However, just like a BC line, each M4 may have extensions to adjacent M4 lines. Using the same approach as Tabs coupled to I-Matrix and BC lines, both M3 and M4 can have alternate access to the higher level Tab Network to be directly accessible to the M5, M6 MLAs, etc., where M3 lines behaves like I-M lines and M4 lines behaves like BC lines.

What is claimed is:

1. A programmable logic device comprising:
  a plurality of cells; and
  an interconnect network coupled to the cells, comprising:
    first routing lines of a first level of routing lines, wherein the first level of routing lines spans n logical blocks,
    second routing lines of a second level of routing lines, wherein the second level of routing lines span m+n logical blocks where m is different from n, and
    third routing lines of a third level of routing lines, said first and second routing lines programmably and directly bidirectionally coupled to the third routing lines, such that signals are selectively driven from either the first or second routing lines to the third routing lines and signals are selectively driven from third routing lines to the first routing lines and the second routing lines.

2. A programmable logic device comprising:
  a plurality of cells; and
  an interconnect network coupled to the cells, comprising:
    first routing lines of a first level of routing lines, wherein the first level of routing lines spans n logical blocks,
    second routing lines of a second level of routing lines, wherein the second level of routing lines spans k+m+n logical blocks where k is different from m and n and m is different from n, and
    third routing lines of a third level of routing lines, said first and second routing lines programmably and directly bidirectionally coupled to the third routing lines, such that signals are selectively driven from either the first or second routing lines to the third routing lines and signals are selectively driven from third routing lines to the first routing lines and the second routing lines.

3. A programmable logic circuit comprising:
  a first plurality of configurable cells organized in two dimensions, said configurable cells grouped into substantially same size regions to form a level of hierarchy;
  a second plurality of configurable cells, located in proximity together to form a first region, comprising a subset of configurable cells of said first plurality of cells;
  a first set of routing lines, spanning a dimension of said first region and configured to couple to input ports and output ports of configurable cells of said second plurality of configurable cells through a first set of switches, wherein an output port of a configurable cell of said second plurality of configurable cells is coupled to at least one input port of other configurable cells of the second plurality of configurable cells;
  a third plurality of configurable cells comprising at least the configurable cells of said second plurality of configurable cells to form a second region larger than said first region;
  a second set of routing lines, spanning a dimension of said second region and configured to couple to input ports and output ports of the configurable cells of said third plurality of configurable cells through a second set of switches, wherein an output port of a configurable cell of said third plurality of configurable cells selectively coupled to drive a first routing line of said second set of routing lines through said second set of switches;
  a third set of switches, said first set of routing lines selectively coupled to said second set of routing lines through the third set of switches;
  a fourth plurality of configurable cells comprising at least the configurable cells of said third plurality of configurable cells to form a third region larger than said second region; and
  a second routing line of a third set of routing lines, spanning a dimension of said third region and configured to couple to drive at least a third routing line of said first set of routing lines and said first routing line through a fourth set of switches.

4. The programmable logic circuit as set forth in claim 3, wherein the switches comprise components selected from the group consisting of switches, programmable passgates and program controlled drivers/receivers.

5. The programmable logic circuit as set forth in claim 3, wherein said first routing line is selectively coupled to drive said second routing line through a switch.

6. The programmable logic circuit as set forth in claim 3, wherein said third routing line is selectively coupled to drive said second routing line through a switch.

7. The programmable logic circuit as set forth in claim 3, further comprising a fourth set of routing lines, routing lines of the fourth set of routing lines having different spans than routing lines of the third set of routing lines, said routing lines of the fourth set of routing lines being selectively coupled to said first and second sets of routing lines through said fourth set of switches.

8. The programmable logic circuit as set forth in claim 3, further comprising a fifth set of switches selectively coupling routing lines of said third set of routing lines in a first dimension to routing lines of said third set of routing lines in a second dimension.

9. The programmable logic circuit as set forth in claim 3, further comprising a sixth set of switches selectively coupling routing lines of said first sets of routing lines of two adjacent first regions.

10. The programmable logic circuit as set forth in claim 3, further comprising a seventh set of switches selectively coupling routing lines of said second set of routing lines of two adjacent second regions.

11. The programmable logic circuit as set forth in claim 3, further comprising an eighth set of switches selectively coupling routing lines of said third set of routing lines of two adjacent third regions.

12. The programmable logic circuit as set forth in claim 3, further comprising a fourth routing line of said first set of routing lines to selectively couple a fifth routing line of said third set of routing lines through a first switch of said fourth set of switches and a sixth routing line of said third set of routing lines through a second switch of said fourth set of switches.

13. The programmable logic circuit as set forth in claim 12, further comprising a seventh routing line of said second set of routing lines selectively coupling said fifth routing line through said first switch, and selectively coupling said sixth routing line through said second switch.

14. The programmable logic circuit as set forth in claim 7, further comprising at least a fifth set of routing lines selectively coupled to said fourth set of routing lines through a ninth set of switches.

15. A programmable logic circuit comprising:
a first routing line, a second routing line, a third routing line, a fourth routing line, and a fifth routing line wherein said first, second, fourth and fifth routing lines have different spans;
said first routing line selectively coupling to the third routing line through a first switch;
said second routing line selectively coupling to the third routing line through a second switch;
said third routing line selectively coupling to the fourth routing line through a third switch; and
said third routing line selectively coupling to the fifth routing line through a fourth switch.

16. The programmable logic circuit as set forth in claim 15, wherein the first, second, third, fourth, and fifth switches consist of components selected from the group comprising switches, programmable passgates and program controlled drivers/receivers.

17. The programmable logic circuit as set forth in claim 15, wherein an output port of a configurable cell of a first plurality of configurable cells is selectively coupled to an input port of another configurable cell of said first plurality of configurable cells through said first routing line.

18. The programmable logic circuit as set forth in claim 15, wherein an output port of a configurable cell of a second plurality of configurable cells, said second plurality of configurable cells comprising at least the configurable cells of said first plurality of configurable cells, is selectively coupled to an input port of another configurable cell of said second plurality of configurable cells through said second routing line.

19. The programmable logic circuit as set forth in claim 15, further comprising a sixth routing line, said fourth and said sixth routing lines having equal spans, said sixth routing line selectively coupled to said third routing line through a fifth switch.

20. The programmable logic circuit as set forth in claim 15, further comprising a seventh routing line along a different dimension from said fourth routing line, said fourth routing line selectively coupled to said seventh routing line through a sixth switch.

21. The programmable logic circuit as set forth in claim 15, further comprising an eighth routing line parallel to said fourth routing line, said fourth routing line selectively coupled to said eighth routing line through a seventh switch.

22. A method for programming a programmable logic circuit comprising:
organizing a first plurality of configurable cells in two dimensions;
grouping the first plurality of configurable cells into substantially same size regions to form a level of hierarchy;
locating a second plurality of configurable cells in proximity to form a first region, the first region comprising a subset of configurable cells of said first plurality of cells;
selectively coupling input ports and output ports of configurable cells of the second plurality of configurable cells through a first set of routing lines spanning a dimension of said first region, wherein an output port of a configurable cell of said second plurality of configurable cells is coupled to at least one input port of other configurable cells of the second plurality of configurable cells;
locating a third plurality of configurable cells comprising at least the configurable cells of said second plurality of configurable cells to form a second region larger than said first region;
selectively coupling an output port of a configurable cells of the third plurality of configurable cells to drive a first routing line of a second set of routing lines, routing lines of the second set of routing lines spanning a dimension of the second;
selectively coupling the first set of routing lines to said second set of routing lines;
locating a fourth plurality of configurable cells comprising at least the configurable cells of said third plurality of configurable cells to form a third region larger than said second region; and
selectively coupling a second routing line of a third set of routing lines, spanning a dimension of said third region, to drive at least a third routing line of said first set of routing lines and said first routing line.

23. The method as set forth in claim 22, further comprising selectively coupling the first routing line to drive said second routing line.

24. The method as set forth in claim 22, further comprising selectively coupling said third routing line to drive said second routing line.

25. The method as set forth in claim 22, further comprising further comprising selectively coupling a fourth set of routing lines, having different spans than said third set of routing lines, to said first and second sets of routing lines.

26. The method as set forth in claim 22, further comprising selectively coupling routing lines of said third set of routing lines in a first dimension to routing lines of said third set of routing lines in a second dimension.

27. The method as set forth in claim 22, further comprising selectively coupling routing lines of said first sets of routing lines of two adjacent first regions.

28. The method as set forth in claim 22, further comprising selectively coupling routing lines of said second sets of routing lines of two adjacent second regions.

29. The method as set forth in claim 22, further comprising selectively coupling routing lines of said third sets of routing lines of two adjacent third regions.

30. The method as set forth in claim 22, further comprising selectively coupling a fourth routing line of the first set of routing lines to a fifth routing line of said third set of routing lines and sixth routing lines of said third set of routing lines.

31. The method as set forth in claim 30, further comprising selectively coupling said fifth routing line and said sixth routing line through a seventh routing line of said second set of routing lines.

32. The method as set forth in claim 25, further comprising selectively coupling at least a fifth set of routing lines to said fourth set of routing lines.

33. A method for programming a programmable logic circuit comprising:
- providing a first routing line, a second routing line, a third routing line, a fourth routing line, and a fifth routing line wherein said first, second, fourth and fifth routing lines have different spans;
- selectively coupling the first routing line to the third routing line;
- selectively coupling said second routing line to the third routing line;
- selectively coupling the third routing line to the fourth routing line; and
- selectively coupling said third routing line to the fifth routing line.

34. The method as set forth in claim 33, further comprising selectively coupling an output port of a configurable cell of a first plurality of configurable cells to an input port of another configurable cell of said first plurality of configurable cells through said first routing line.

35. The method as set forth in claim 33, selectively coupling through said second routing line an output port of a configurable cell of a second plurality of configurable cells, said second plurality of configurable cells comprising at least the configurable cells of said first plurality of configurable cells, to an input port of another configurable cell of said second plurality of configurable cells.

36. The method as set forth in claim 33, further comprising selectively coupling a sixth routing line, said fourth and said sixth routing lines having equal spans, to said third routing line.

37. The method as set forth in claim 33, further comprising selectively coupling the fourth routing line to a seventh routing line along a different dimension from said fourth routing line.

38. The method as set forth in claim 33, further comprising selectively coupling an eighth routing line parallel to said fourth routing line.

* * * * *